US008609522B2

(12) United States Patent
Gassilloud et al.

(10) Patent No.: US 8,609,522 B2
(45) Date of Patent: Dec. 17, 2013

(54) PROCESS FOR PRODUCING A CONDUCTING ELECTRODE

(75) Inventors: Remy Gassilloud, Saint-Laurent-du-Pont (FR); François Martin, Grenoble (FR)

(73) Assignee: Commissariat à l'énergie atomique et aux ènergies alternatives, Paris (FR)

(*) Notice: Subject to any disclaimer, the term of this patent is extended or adjusted under 35 U.S.C. 154(b) by 0 days.

(21) Appl. No.: 13/634,350

(22) PCT Filed: Mar. 11, 2011

(86) PCT No.: PCT/FR2011/050496
§ 371 (c)(1),
(2), (4) Date: Oct. 25, 2012

(87) PCT Pub. No.: WO2011/114046
PCT Pub. Date: Sep. 22, 2011

(65) Prior Publication Data
US 2013/0075832 A1    Mar. 28, 2013

(30) Foreign Application Priority Data
Mar. 15, 2010 (FR) .................................... 10 51832

(51) Int. Cl.
*H01L 21/44* (2006.01)
(52) U.S. Cl.
USPC ............. 438/573; 257/E29.126; 257/E29.137
(58) Field of Classification Search
USPC .............................. 438/3, 142, 197, 240, 573; 257/E29.126, 29.137
See application file for complete search history.

(56) References Cited

U.S. PATENT DOCUMENTS

| 6,830,998 B1 | 12/2004 | Pan et al. |
| 2005/0136677 A1 | 6/2005 | Brask et al. |
| 2007/0178681 A1 | 8/2007 | Chung et al. |
| 2007/0201265 A1* | 8/2007 | Ranjan et al. ................ 365/158 |

FOREIGN PATENT DOCUMENTS

| WO | WO 2006/019675 A1 | 2/2006 |
| WO | WO 2007/005312 A1 | 1/2007 |

OTHER PUBLICATIONS

International Search Report as issued for PCT/FR2011/05496.

(Continued)

*Primary Examiner* — Brook Kebede
(74) *Attorney, Agent, or Firm* — Pillsbury Winthrop Shaw Pittman LLP

(57) ABSTRACT

A process for producing a conducting electrode on a substrate, including: depositing a layer made of a dielectric; depositing a protective layer made of the nitride of a metal on the dielectric layer; depositing a functionalization layer made of a material including a chemical species, such that the free enthalpy of formation of the nitride of the species is less, in absolute value, than the free enthalpy of formation of the nitride of the metal of the protective layer over the temperature range between 0° C. and 1200° C.; and annealing the assembly including the protective layer and the funtionalization layer so that the species diffuse from the functionalization layer into the protective layer and the nitrogen atoms migrate from the protective layer into the functionalization layer.

16 Claims, 8 Drawing Sheets

(56) References Cited

OTHER PUBLICATIONS

Hasan Musarrat et al.; "Ultralow work function of scandium metal gate with tantalum nitride interface layer for n-channel metal oxide semiconductor application", Applied Physic Letters, AIP, American Institute of Physics, Melville, NY, US LNKD-DOI:10.1063/1.711398, vol. 90, No. 10, Mar. 7, 2007, pp. 103510-1-103510-3; XP012093514.

Yeo; "Metal gate technology for nanoscale transistors—material selection and process integration issues"; Thin Solid Films, Elsevier-Sequoia S.A. Lausanne, CH LNDK-DOI:10.1016/J.TSF.2004.05.039, vol. 462-463, Sep. 1, 2004, pp. 34-41, XP004556932.

Cha et al; "Work function and thermal stability of Ti1-xAlxNy for dual metal gate electrodes", Applied Physics Letters, vol. 81, No. 22, Nov. 25, 2002, pp. 4192-4194, DOI: 10.1063/1.1523651.

International Search Resort as issued for PCT/FR2011/05496.

* cited by examiner

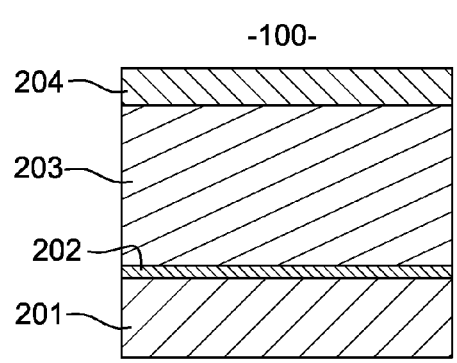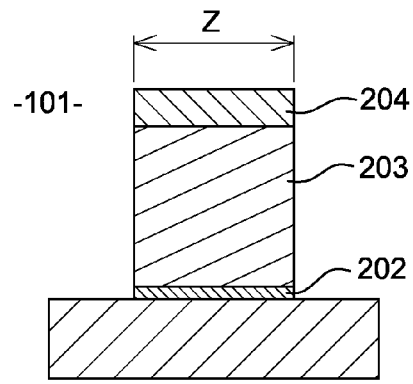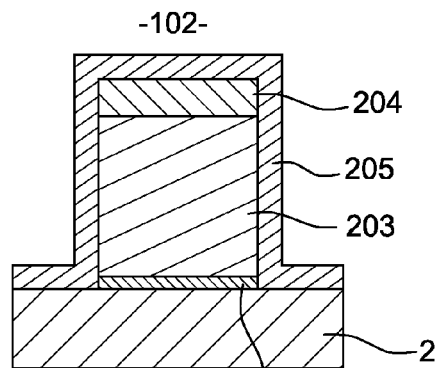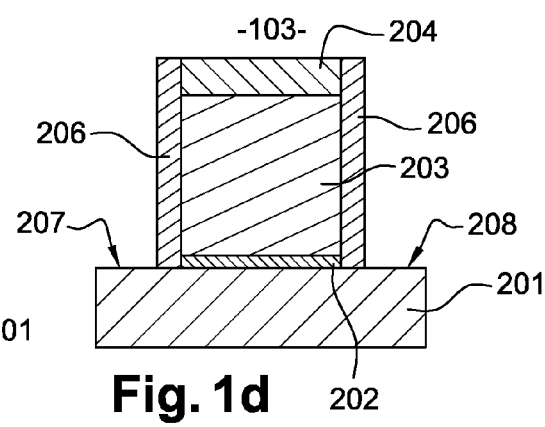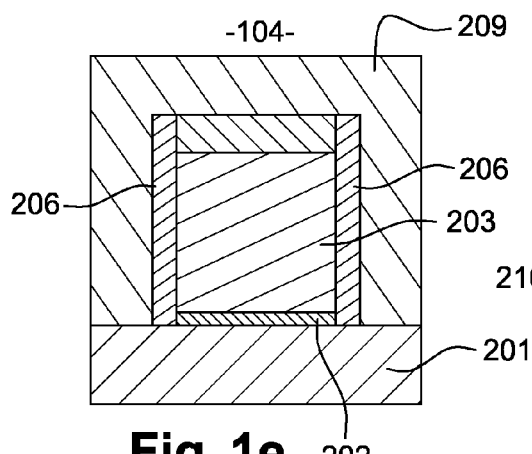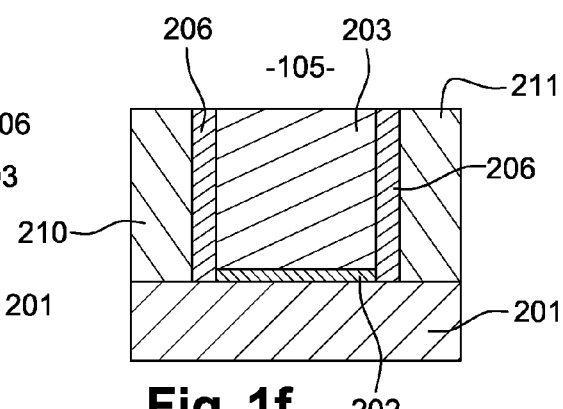

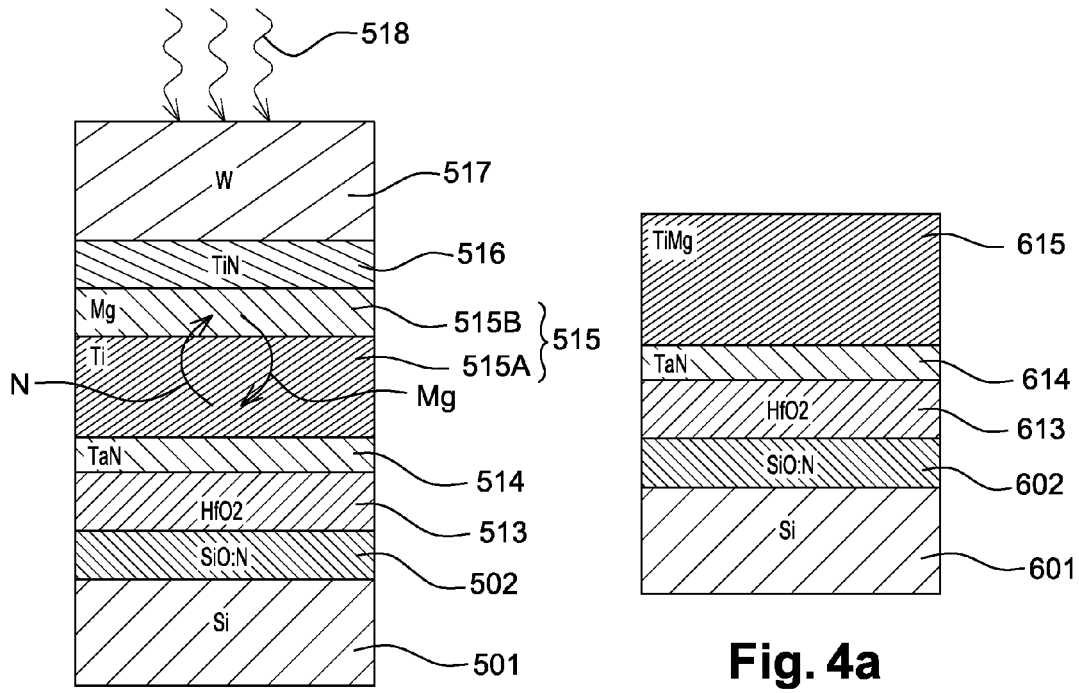
Fig. 3
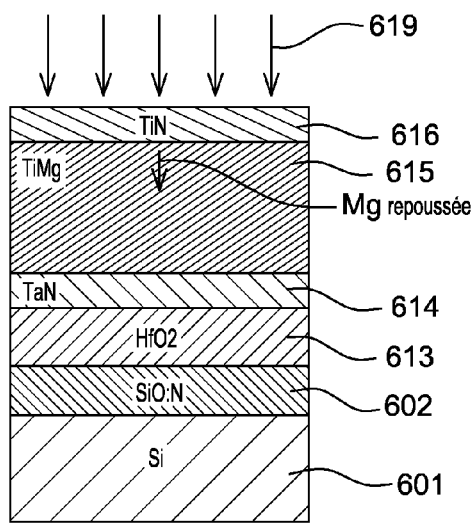
Fig. 4a
Fig. 4b

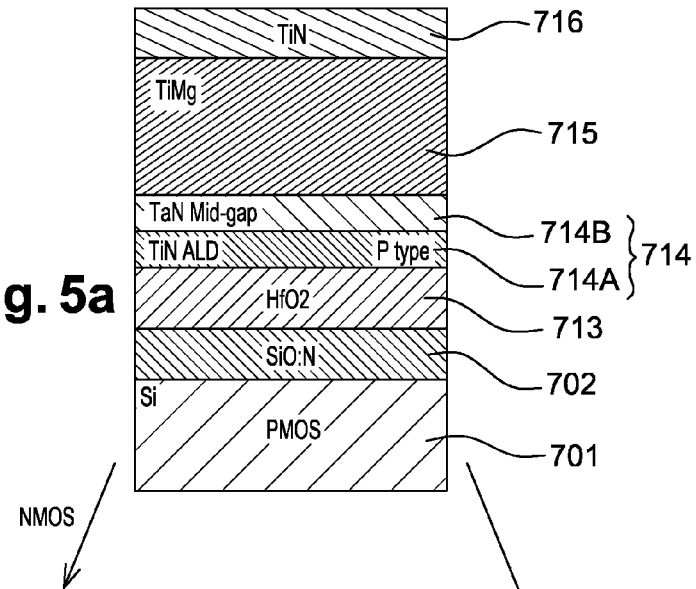
Fig. 5a
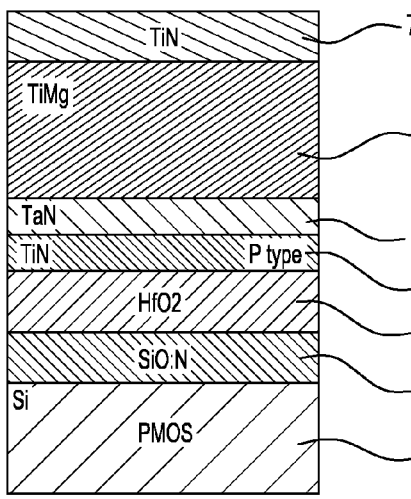
Fig. 5b
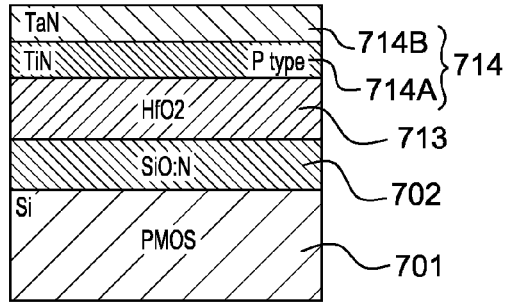
Fig. 5b-bis

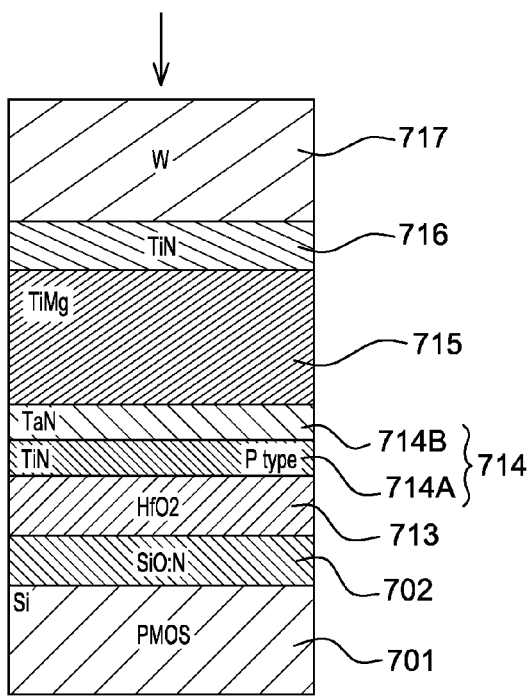
Fig. 5c
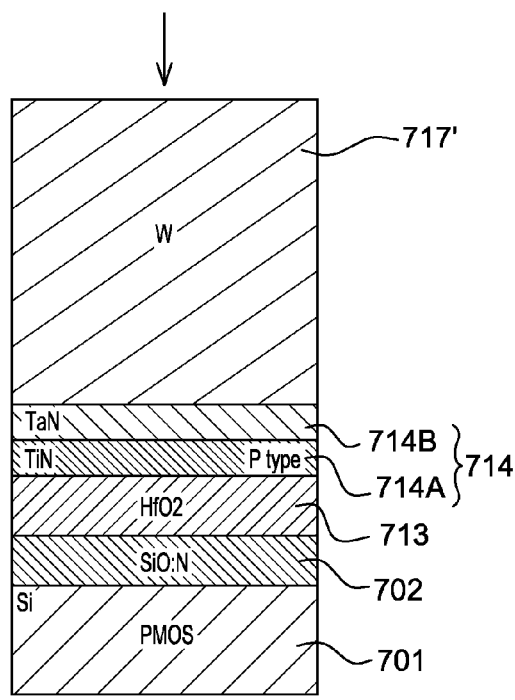
Fig. 5c-bis
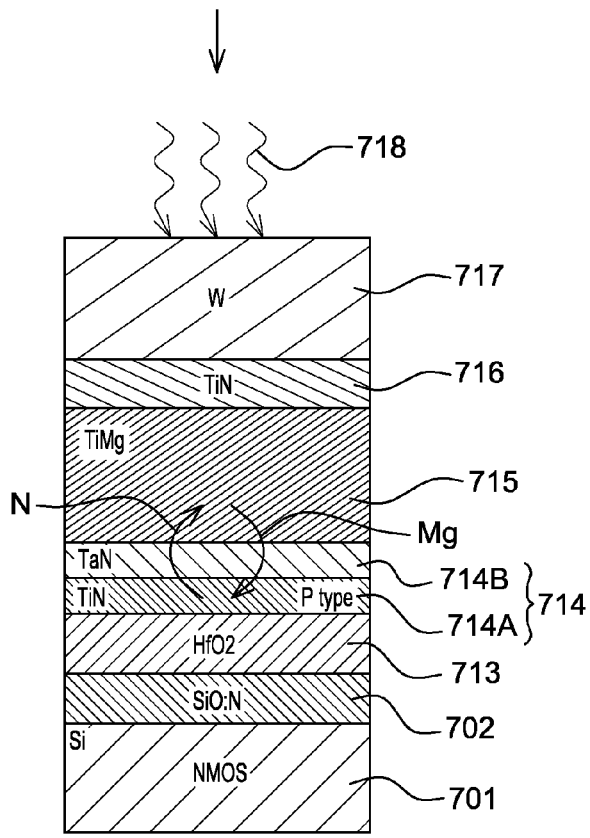
Fig. 5d
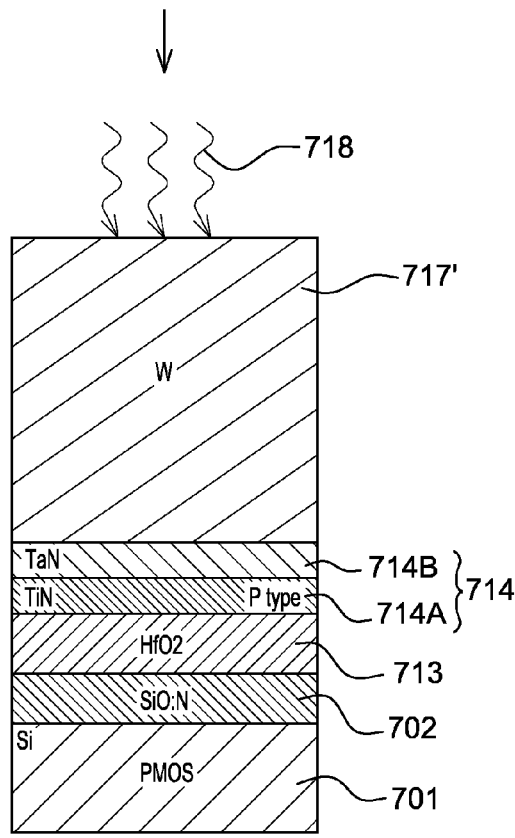
Fig. 5d-bis

PROCESS FOR PRODUCING A CONDUCTING ELECTRODE

CROSS REFERENCE TO RELATED APPLICATIONS

This application is the U.S. National Stage of PCT/FR2011/050496, filed Mar. 11, 2011, which in turn claims priority to French Patent Application No. 1051832, filed Mar. 15, 2010, the contents of all applications are incorporated herein by reference in their entireties.

The present invention relates to a process for producing a conducting electrode. The invention finds a particularly s interesting application in the context of producing a metal gate of an n-MOS transistor, i.e., a MOSFET transistor in which the inversion channel is constituted of electrons (i.e., P-type doped channel and N-type doped source and drain areas).

The race to reduce the dimensions of transistors involves new constraints to take into consideration to produce these transistors. Therefore, for producing advanced MOS transistors in conformance with increasingly lower technology nodes (typically 32 nm and 22 nm technology nodes such as defined by the ITRS "International Technology Roadmap for Semiconductors"), a reduction in the thickness of the silicon dioxide ($SiO_2$)-based dielectric gate has become essential. With a thickness of less than a nanometer for 32, nm and 22 nm generations (knowing that the minimum physical thickness of $SiO_2$ represents a monolayer on the order of 4 Å), these gate oxides no longer maintain sufficient electrical insulation between the gate, generally made of polysilicon, and the conduction channel. The leakage current through the oxide is no longer insignificant. It may then essentially be controlled by the tunnel current transiting through the gate oxide, thereby compromising the functionality of the transistor and leading to high power consumption that may reduce the use time of the portable devices integrating such transistors. This direct tunnel current is generated by electrons of energy less than the barrier height that may traverse the entire dielectric without passing through the conduction band of the dielectric and will increase with increasingly lower dielectric thicknesses. Therefore, when the $SiO_2$ thickness is reduced to a few atomic layers, leakages by the direct tunnel effect present a major disadvantage.

A known solution to this problem consists of using materials with high dielectric constant, known as a "high-k" material, to replace the $SiO_2$ or SiO:N to reduce leakage currents. By maintaining a high capacity with higher dielectric thicknesses than for $SiO_2$, high-k materials thereby reduce gate leakage.

However, such a solution presents a few difficulties. In fact, due to chemical incompatibilities between materials, it is not possible to use a polysilicon gate on a high-k dielectric (interface reaction or interdiffusion reaction phenomena induced, for example, by various annealings).

The problem raised above may be resolved by employing a metal gate; therefore, the. use of certain metallic materials for the gate enables the problem of electrical characteristic degradation due to reactivity between the polysilicon gate and the high-k dielectric to be resolved.

However, selection of the particular metal gate material is delicate: The material must in fact not only be compatible with a high-k dielectric but also must be chemically stable and present a work function whose influence on the threshold voltage value of the transistor is considerable, the latter depending directly on the work function of the chosen metal. In the case of a polysilicon gate, the work function may be modulated so as to obtain a correct threshold voltage value for the case of an n-MOS and another value for the p-MOS. In the case of the use of a metal gate, for a CMOS technology, it will most often be necessary to integrate a different metal for each of the two types of transistors so as to approach work functions close to those of an n+ and p+ doped polysilicon gate; In particular, a work function in the [4.1-4.4 eV] and [4.8-5.1 eV] interval would be interesting for n-MOS and p-MOS respectively. For each gate, the challenge is therefore to be able to identify a metallic material whose properties must cover the desired work function range and that is compatible with the CMOS production process and more particularly with the gate dielectric.

Two approaches for forming metal gates may generally be distinguished: a first approach known as "gate first" and a second approach known as "gate last."

The "gate first" approach keeps the order of the standard process with production of a polysilicon gate. The metal is simply deposited in the place of the gate polysilicon. The main difficulties of such a process relate to the contamination of "front end" equipment during the production process and gate metal etching and gate stack integrity during high-temperature annealings, for example dopant activation annealing after implantation in the drain and source areas.

The "gate last" approach is described, for example, in document US2005/0136677. According to this process, the gates formed by the high-k/metal stack of a CMOS circuit are produced by replacing a gate designated a "sacrificial" gate in polysilicon. In a first production step, the polysilicon gates of areas N (respectively P) are protected by masking. The gates from areas P (respectively N) are then etched and the areas thus recessed are filled by a high-k/metal N stack (identically, high-k/metal P) enabling n-MOS (respectively p-MOS) type transistors to be defined. Then, a planarization by chemical mechanical polishing, also called CMP, step enables access to the area N filling polysilicon gates. The n-MOS transistor gates are protected by masking and the areas N (respectively P) are recessed and then filled by a high-k/metal P enabling p-MOS (respectively n-MOS) type transistors to be defined. Lastly, a new CMP step separates gates P and N. This "gate last" process is based, in particular, on the principle of the damascene process consisting of filling previously-recessed sacrificial polysilicon cavities with a material and then polishing the surface so as to eliminate the surface surplus.

A possible variation of this process is described in document US2006/0121678. On behalf of the sequential iterative process described above (first masking, first recessing, first filling, first CMP, second masking, second recessing, second filling, second CMP), the alternative w process is called "approach by gate metal removal." In this CMOS circuit production process, an N-type (respectively P) metal gate is first deposited on a high-k dielectric after recessing areas N and P. Areas P (respectively N) are then protected by a mask. The N (or respectively P) type metal unprotected by the mask is removed by etching and replaced by a P type metal. The main disadvantage of this type of integration resides in the need to remove metal by chemical or dry process etching on a high-k dielectric without impacting the latter.

In general, the advantage of the "gate last" process with relation to the "gate first" process is that it enables the integrity of the gate stack to be preserved during high-temperature annealings, for example, dopant activation annealing after implantation in drain and source areas, to the extent that the gate metal is deposited after high-temperature treatments. On the contrary, the particular gate metal may only be obtained at a low thermal budget.

As regards the metal enabling the desired work function to be obtained in "gate last" technology, document WO2006/019675 proposes using an aluminum-based alloy to produce the n-MOS transistor gate in "gate last" technology. It is therefore known to the person skilled in the art that a ternary gate produced in a $Ti_{1-x}Al_xN_y$ (with x=0.25 and y<1) type material has behavior N when it is deposed on $SiO_2$ and annealed at a moderate thermal budget, typically 600° C. (Cha et al, Applied Physics Letters 81, No. 22, p. 4193 (2002). However, such a solution also poses certain difficulties.

Therefore, by using an aluminum-based alloy, one obtains a minimum work function value equal to 4.36 eV under optimal deposition and nitrogen percentage conditions while it should be helpful to reach work functions at the edges of the conduction band (i.e., on the order of 4.1 eV).

Modulating the work function via the implantation of dopants was also considered. However, the low gate thicknesses make this type of implantation very delicate to implement.

In this context, the object of the present invention is to provide a process to produce a conducting electrode on a dielectric layer, particularly for producing a metal gate of an n-MOS transistor on a high-k type dielectric layer, this process imposing the particular electrode work function to a low thermal budget while guaranteeing the integrity of the dielectric layer.

In this context, the object of the present invention is to provide a process for producing a conducting electrode on a substrate comprising the following steps:

- depositing a layer made in a dielectric material;
- depositing on the dielectric layer a protective layer made of the nitride of a metal M;
- depositing a functionalization layer made of a material comprising a chemical species E such that the free enthalpy of formation of the nitride of this species is less, in absolute value, than the free enthalpy of formation of the nitride of the metal M of said protective layer over a temperature range of between 0 and 1200° C., said chemical species E being chosen from among the following species: Mg or Ca;
- annealing the assembly comprising said protective layer and said functionalization layer such that the species E at least partially diffuse from said functionalization layer into said protective layer and the nitrogen atoms at least partially migrate from said protective layer into said functionalization layer, said conducting electrode including said protective and functionalization layers after annealing.

Free enthalpy of formation of a compound is understood to refer to the variation in free enthalpy accompanying the formation reaction of this compound from the elements forming the compound.

Thanks to the invention, a protective layer is used to guarantee the integrity of the dielectric layer. Deposition of this protective layer will preserve the electrical quality of the dielectric/metal interface during production of the component integrating the electrode (preferentially a gate electrode of an n-MOS transistor obtained by a "gate last" process); this protective layer will, in particular, be used as an etch stop layer enabling the electrical properties of the dielectric to be preserved.

The protective layer must then be functionalized in the second part of production so that the assembly formed by the protective layer and the functionalization layer presents, after thermal activation, the desired work function. In general, the principle of this functionalization is as follows: The functionalization layer acts as a source capable of feeding the protective layer species E under the effect of diffusion during annealing. The material (for example TaMg or TiMg) of the functionalization layer will preferentially be chosen so as to guarantee the release of oxygen coming from an oxidation layer potentially present at the surface of the protective layer and induced by the various technological steps of production, for example the production of a transistor obtained according to a gate last process. In the case of TaMg or TiMg, the Ta or Ti will reduce the oxide potentially present on the surface of the protective layer. The choice of such a material for the functionalization layer will facilitate diffusion of species E into the protective layer. At the same time, the protective layer will be stripped of nitrogen by exodiffusion into the nitrogen-hungry functionalization layer and redistribution of concentrations between the functionalization layer and the protective layer. In other words, the functionalization layer draws in the nitrogen present in the protective layer. This denudation phenomenon is ensured by the fact that the free enthalpy of formation of the nitride of species E is less, in absolute value, than the free enthalpy of formation of the nitride of metal M of the protective layer. By way of preferential example, species E may be magnesium Mg in the event of production of a gate of an n-MOS transistor in "gate last" technology; in this case, the protective layer must then be functionalized so that the protective layer and functionalization layer assembly presents, after thermal activation, type N behavior (i.e., a work function of between 4.1 eV and 4.3 eV). The thermal budget must not exceed 500° C. at this production step to the extent that the source and drain junctions have already been silicided (exceeding this thermal budget may lead to degradation of the siliconizing). Mg presents particular physical properties responding to the need of an N type gate diffusing at a low thermal budget for n-MOS transistors in "gate last" technology. These properties are:

- a low work function (3.6 eV);
- a diffusion capacity compatible with the thermal budget in "gate last" technology;
- a low chemical affinity with nitrogen.

By virtue of its affinity with oxygen, it is preferable that magnesium be alloyed with another metal so as to reduce its reactivity. In addition, the quantity of Mg in this alloy must be adjusted to provide a sufficient source of Mg in the protective layer. For example, TiMg may be used as a functionalization layer. It is a source of Mg, the latter then being free to diffuse into the protective layer (for example a protective layer in TaN) since titanium reduces the oxide potentially present at the surface of the protective layer in contact with the dielectric layer in high-k. In addition, TiMg will enable denudation of the nitrogen from the protective layer by redistribution of concentrations between the protective layer and the functionalization layer. The combination of diffusion of Mg and denudation of nitrogen enables an N type gate to be obtained after annealing.

It will be noted that the functionalization layer may itself be composed either of a single layer produced in a species E-based alloy or of two or more layers, one of which is a layer of species E (such that the species E-based alloy is formed at the time of thermal annealing).

The process according to the invention may also present one or more of the characteristics below, considered individually or according to all technically possible combinations:

- the dielectric layer is an insulation material in which the dielectric constant is equal to or greater than that of silicon dioxide, particularly $SiO_2$, SiO:N or a material with a high dielectric constant, designated a high-k material;

the thicknesses of the protective and functionalization layers are equal to or less than 5 nm;

the functionalization layer material is chosen from among the following materials: TaMg, TiMg, ZrMg, HfMg, TaMgN or TiMgN, ZrMgN, HfMgN, TaCa, TiCa, ZrCa, HfCa, TaCaN, TiCaN, ZrCaN, HfCaN, TaMgCa, TiMgCa, ZrMgCa, HfMgCa, TaMgCaN, TiMgCaN, ZrMgCaN, HfMgCaN;

the protective layer is a layer in TiN, TaN, TiCN or TaCN presenting, before annealing, a work function in the middle of the silicon bandgap;

the protective layer is produced in the form of a bilayer by the successive deposition of a first layer presenting, before annealing, type P behavior, and a second layer presenting, before annealing, a work function in the middle of the silicon bandgap;

the protective layer is produced in the form of a bilayer by the successive deposition of a layer of TiN presenting, before annealing, type P behavior, and a layer of TaN presenting, before annealing, a work function in the middle of the silicon bandgap;

the annealing temperature of the assembly comprising said protective layer and said functionalization layer is strictly less than 500° C.;

the process according to the invention comprises a step of depositing a dielectric interface base layer between the dielectric layer and the substrate;

the process according to the invention comprises a step of depositing a capping layer above the functionalization layer capable of protecting the functionalization layer from oxidation, said capping layer undergoing said annealing;

the capping layer is produced in a nitrided material such as TiN, TaN, TiCN or TaCN;

nitriding of the capping layer is obtained by a plasma treatment;

The process according to the invention comprises the following steps:
deposition of the dielectric interface base layer on the substrate;
deposition of a layer in sacrificial polysilicon;
production of drain and source areas;
production of a damascene cavity by removal of the sacrificial polysilicon;
deposition of the layer produced in the dielectric material, said dielectric material being a high-k type material;
depositing on the dielectric layer a protective layer made of the nitride of a metal M;
depositing on the protective layer a functionalization layer;
depositing on the functionalization layer a capping layer;
deposition of a metallic material to fill in the remainder of the damascene cavity;
annealing the assembly comprising said protective layer and said functionalization layer such that the species E partially diffuse from said functionalization layer into said protective layer and the nitrogen atoms partially migrate from said protective layer into said functionalization layer;

The process according to the invention comprises the following steps:
deposition of the dielectric interface base layer on the substrate;
deposition on the base layer of the layer produced in the dielectric material, said dielectric material being a high-k type material;
depositing on the dielectric layer a protective layer made of the nitride of a metal M;
deposition of a layer in sacrificial polysilicon;
production of drain and source areas;
production of a damascene cavity by removal of the sacrificial polysilicon with a stop on the protective layer;
depositing on the protective layer a functionalization layer;
depositing on the functionalization layer a capping layer;
deposition of a metallic material to fill in the remainder of the damascene cavity;
annealing the assembly comprising said protective layer and said functionalization layer such that the species E partially diffuse from said functionalization layer into said protective layer and the nitrogen atoms partially migrate from said protective layer into said functionalization layer.

Another object of the present invention is an n-MOS transistor characterized in that the transistor gate is an electrode produced by a process according to the invention.

Other characteristics and advantages of the invention will clearly emerge from the description given below, for indicative and in no way limiting purposes, with reference to the attached figures, among which:

FIGS. 1a to 1j illustrate the various steps of a first embodiment of the process according to the invention;

FIG. 3 illustrates a possible variation for producing the functionalization layer used in the process according to the invention;

Figure 4C:
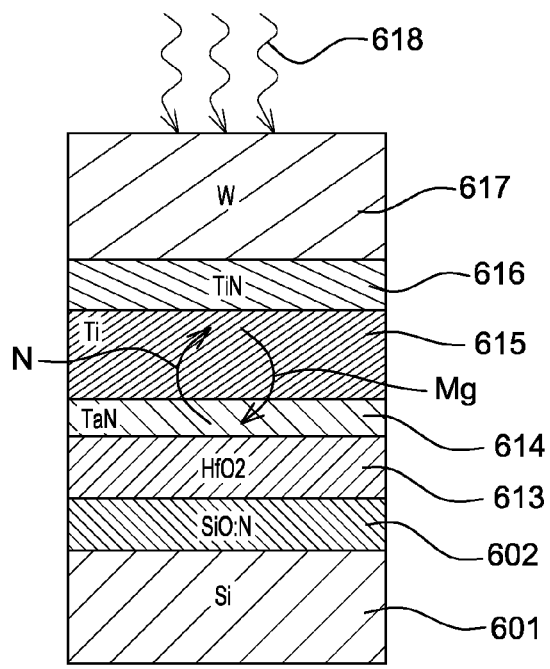
Figure 5:
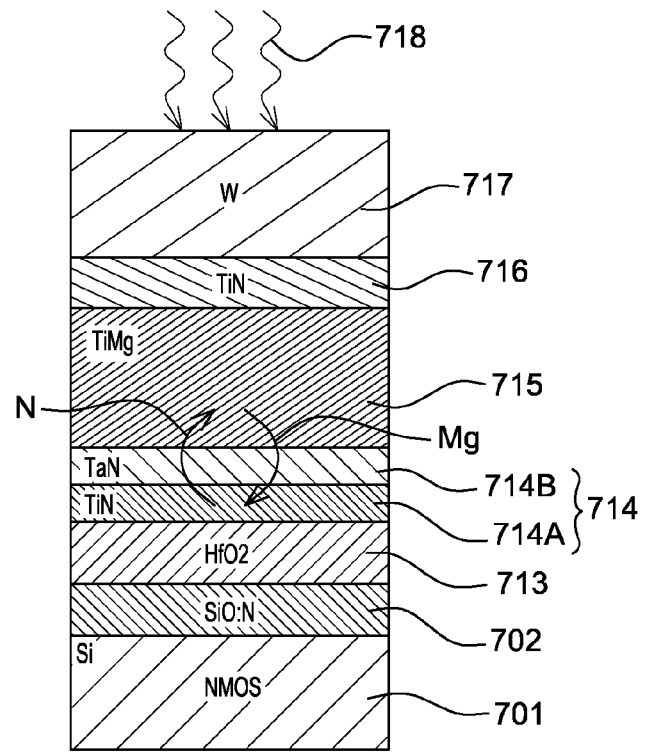

FIGS. 4a to 4c more specifically illustrate an embodiment of a capping layer capable of being used in the process according to the invention;

FIG. 5 illustrates a possible variation for producing the protective layer used in the process according to the invention to obtain an n-MOS gate compatible with producing a p-MOS transistor in "gate last" technology;

FIGS. 5a to 5d and 5d-bis illustrate the use of the bilayer such as represented in FIG. 5.

In all figures, common elements bear the same reference numbers. For reasons of clarity, only the elements useful for understanding the invention have been represented, without respecting the scale and schematic manner.

FIGS. 1a to 1j illustrate the various steps of a first embodiment of the process according to the invention to obtain an n-MOS transistor gate in "gate last" technology. It will be noted that the steps illustrated in 1a to 1g are standard steps known to the person skilled in the art implementing a "gate last" technology according to a damascene structure. Damascene structure is a gate replacement structure: First, a transistor is produced by a conventional production process but the polysilicon gate is sacrificial. The latter defines the source and drain areas in a self-aligned manner. Next the source and drain areas are protected by using a dielectric material and a cavity is made by selectively removing the sacrificial gate. The desired dielectric-gate stack is then deposited in the cavity.

The first step 100 represented in FIG. 1a consists of successively depositing on a substrate 201 (for example a substrate in Si) the following stack:

a dielectric layer 202 in SiO$_2$ that subsequently will be used as an interface base layer between the high-k dielectric and the substrate 201 in Si, a gate layer 203 in sacrificial polysilicon;

a hard mask layer 204 in SiN.

FIG. 1b illustrates an etching step 101 obtaining, from the previously defined stack, a stack with the dimensions of the transistor gate still formed, after etching, by the dielectric layer 202 in SiO$_2$, the gate layer 203 in sacrificial polysilicon and the hard mask layer 4 in SiN.

The etching is carried out by using the hard mask defining area Z intended to subsequently form the gate and protecting said area during the operation.

According to step 102 represented in FIG. 1c, a conformal deposition of a layer 205 of SiN is carried out.

This layer 205 is then etched (step 103 in FIG. 1d) so as to only keep the spacers 206 in SiN. Spacers 206 define the channel length of the transistor and ensure the electrical insulation between the gate and the junctions: They may be obtained via anisotropic etching of the SiN layer 205.

Doping is then carried out by ionic implantation of source and drain areas 207 and 208 on both sides of lateral spacers 206. Therefore in the case of producing an n-MOS transistor on a type p substrate 201, areas 207 and 208 are n+ doped. In order to restore the crystallinity of the material and placement of dopant atoms on substitutional sites, implantation annealing (also designated activation annealing) is then carried out: the temperature of such annealing is on the order of 1000° C.

In order to minimize the resistance of the drain and source areas made of doped monocrystalline silicon, a siliconizing step of these areas is also carried out; The siliconizing corresponds to the metallization of these drain and source areas by chemical reaction between the silicon and a metal (for example nickel) so as to form areas of low resistivity. This siliconizing step of junctions 207 and 208 is obtained at a temperature not exceeding 500° C. It should be noted that at this stage (silicided source and drain junctions), the thermal budget must no longer exceed 500° C. so as to not degrade the siliconizing.

According to step 104 represented in FIG. 1e, filling is then carried out by using a TEOS (Tetra Ethyl Ortho Silane) type dielectric material 209 at a temperature of less than 500° C.

Chemical mechanical polishing, designated CMP (Chemical Mechanical Polishing), is then carried out (step 105 FIG. 1f) with a stop on polysilicon layer 203 so as to remove the added thickness formed by layer 204 of SiN and the layer 209 of TEOS from the upper part of the gate area. Drain and source areas 207 and 208 are protected by lateral parts 210 and 211 in TEOS.

As mentioned previously, the polysilicon layer 203 is a sacrificial layer; According to step 106 illustrated in FIG. 1g, this layer 203 is thus removed so as to expose a damascene cavity 212, for example by selective TMAH (tetramethyl ammonium hydroxide) etching with a stop on layer 202 in SiO$_2$.

Figure 1G:
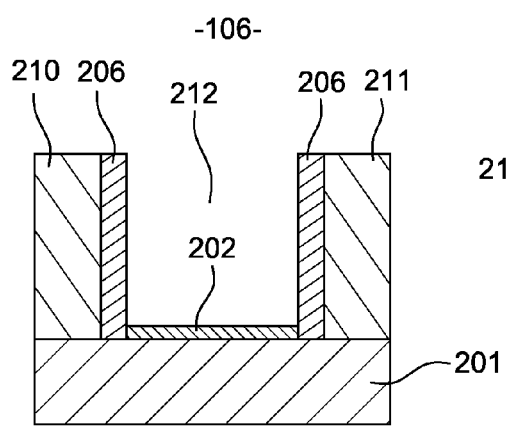
Figure 1H:
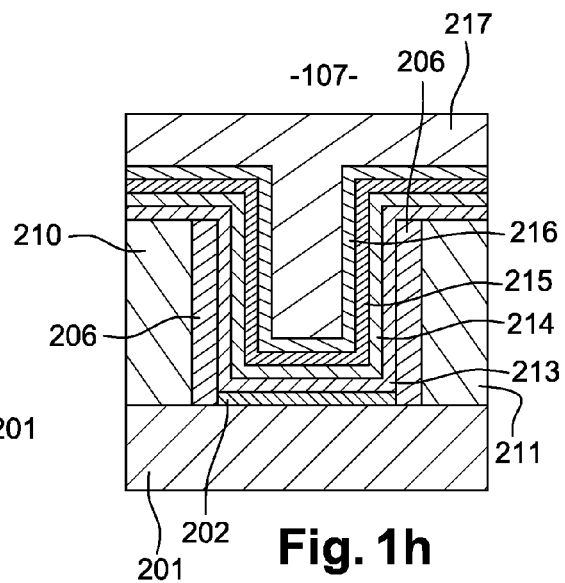
Figure 1I:
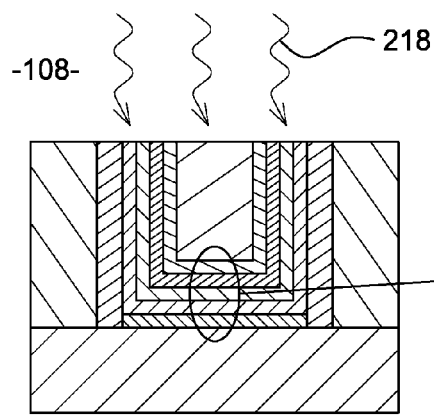

According to step 107 illustrated in FIG. 1h, the m damascene cavity 212 represented in FIG. 1g is filled with a stack formed successively by:

a layer 213 of HfO$_2$ (with a thickness of less than 5 nm and preferentially between 0.5 and 2.5 nm) in contact with the layer 202 in SiO$_2$ (with a thickness of 0.5 to 10 nm);

a protective layer 214 in TaN (with a thickness equal to or less than 5 nm, for example on the order of 2 nm);

a functionalization layer 215 in TiMg (with a thickness equal to or less than 5 nm, for example on the order of 3 nm);

a capping layer 216 in TiN (with a thickness equal to or less than 5 nm).

The act of choosing layers of a thin thickness (i.e., equal to or less than 5 nm) prevents mechanical stress on the gate stack.

The remainder of the damascene cavity (i.e., above the stack formed by layers 213 to 216) is filled with a neutral metal 217 of the tungsten W type. The cavity may be filled with a metal that is chemically neutral with relation to the functional layers and must be relatively easy to polish by CMP. In addition, the composition of this layer may be judiciously chosen so as to create a stress in the n-MOS and p-MOS gate structures in order to improve the electrical characteristics of the transistors. The neutral metal chosen to fill the damascene cavity must preferentially present a resistivity that is less than that of the capping layer 216.

Layer 213 in HfO$_2$ is therefore a layer made in a high-k type material; High-k materials or dielectric materials with a high dielectric constant may be defined as materials having a dielectric constant k strictly less than 3.9 (dielectric constant of silicon). In this instance, the material HfO$_2$ has a dielectric constant close to 20-25.

The protective layer 214 in TaN is a layer made of a metal with a work function around the mid-gap of silicon; i.e., around 4.6-4.7 eV.

Here the role of layer 202 in SiO$_2$ that is used as an interface base oxide layer between the two heterogeneous materials of layer 213 in high-k and substrate 201 in Si (in order to prevent the growth of an uncontrolled, poor quality interface) is understood.

The capping layer 216 in TiN prevents air oxidation of the functionalization layer 215 in TiMg, the magnesium being particularly oxygen hungry.

According to step 108 (FIG. 1i), CMP polishing is carried out to eliminate the added thickness of material over the damascene cavity and then thermal annealing is carried out (illustrated by arrows 218) at a temperature preferentially equal to or greater than 300° C. and strictly less than 500° C. (it is noted that 500° C. constitutes the upper limit of annealing due to the thermal budget limitation linked to the prior siliconizing of the drain and source junctions).

Figure 1J:
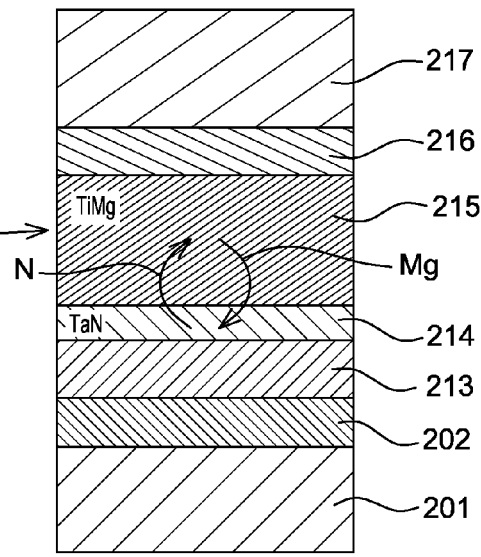

FIG. 1j represents a zoom on the different layers 201, 202, 213, 214, 215, 216 and 217 illustrating phenomena connected to annealing.

The assembly formed by the protective layer 214 and the functionalization layer 215 presents, after thermal activation, type N behavior (i.e., a work function of between 4.1 eV and 4.3 eV). Magnesium presents particular physical properties responding to the need of an N type gate diffusing at a low thermal budget for n-MOS transistors in "gate last" technology. These properties are m as follows:

a low work function (3.6 eV);

a diffusion capacity compatible with the thermal budget in "gate last" technology;

a low chemical affinity with nitrogen.

By virtue of its affinity with oxygen, it is desirable that magnesium be alloyed with another metal so as to reduce its reactivity. In addition, the quantity of Mg in this alloy must be sufficient to guarantee a sufficient source of Mg. According to this first embodiment, TiMg serves as the functionalization layer 215. This functionalization layer 215 is a source of Mg, the latter then being free to diffuse into the thin protective layer 214 in TaN in contact with the high-k layer 213. In addition, the TiMg will enable denudation of the nitrogen N from the protective layer 215 by redistribution of concentrations between the protective layer 214 and the functionalization layer 215. The chemical affinity of nitrogen with Mg must preferably be lower than that of Ti, so that the nitrogen redistribution in the functionalization layer 215 in TiMg does not block the diffusion of Mg into protective layer 214 by formation of MgN. The combination of diffusion of Mg and nitrogen denudation obtains, after annealing, a type N metal gate comprising the functionalization layer 215 and the protective layer 214 after thermal annealing, said metal gate being formed on a high-k dielectric layer 213.

It will be noted that the capping layer 216 must preferentially be chosen so that the Mg descends into the m protective layer 214 rather than rising back up into the capping layer 216. This is the case here since the free enthalpy of formation at 300K of TiN ($\Delta G(300K)TiN=-742kJ$) is greater than that of TaN ($\Delta G(300K)TaN=-657kJ$): The TaN bond is therefore weaker than the TiN bond such that the Mg will preferentially take the place of nitrogen in protective layer 216 in TaN than in capping layer 216 in TiN.

FIGS. 2a to 2j illustrate the various steps of a second embodiment of the process according to the invention to obtain an n-MOS transistor gate in "gate last" technology. It will be noted that this second embodiment is differentiated from the first embodiment described with reference to FIGS. 1a to 1j in that the high-k dielectric layer will be deposited first and undergoes activation annealing of the source and drain junctions.

Figure 2A:
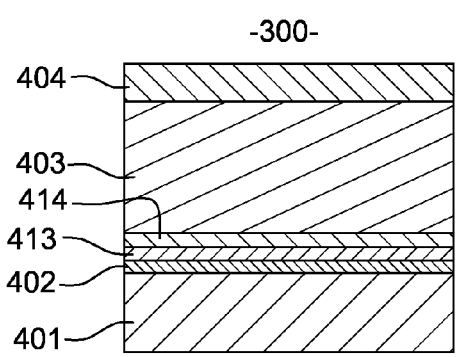
FIGS. 2a to 2j illustrate the various steps of a second embodiment of the process according to the invention.

The first step 300 represented in FIG. 2a consists of successively depositing on a substrate 401 (for example a substrate in Si) the following stack:
 a dielectric layer 402 in $SiO_2$
 a high-k dielectric layer 413 in $HfO_2$ (with a thickness of less than 5 nm and preferentially between 0.5 and 2.5 nm), layer 402 in $SiO_2$ serving as an interface base layer between the high-k dielectric and substrate 401 in Si;
 a protective layer 414 in TaN (with a thickness equal to or less than 5 nm, for example on the order of 2 nm);
 a gate layer 403 in sacrificial polysilicon;
 a hard mask layer 404 in SiN.

Figure 2B:
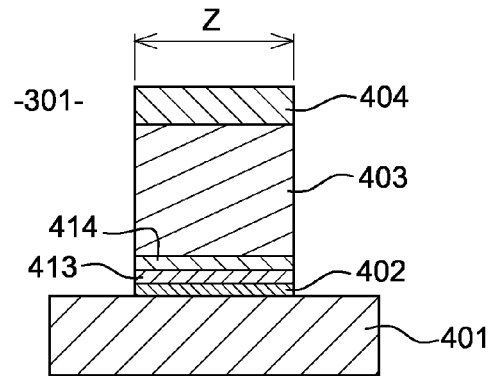
Figure 2C:
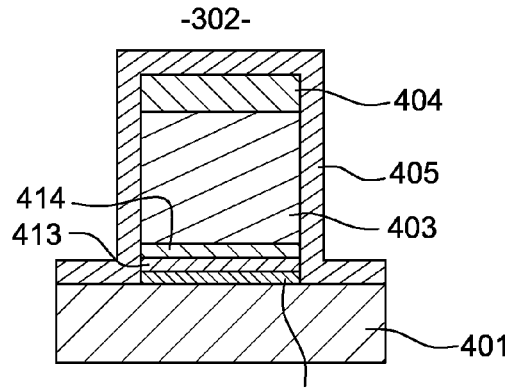
Figure 2D:
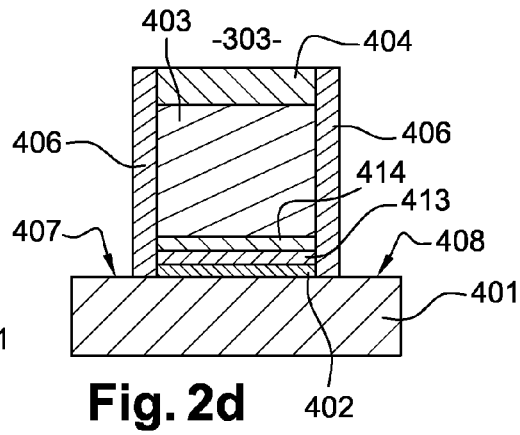

FIG. 2b illustrates an etching step 301 obtaining, from the previously defined stack, a stack with the dimensions of the transistor gate still formed, after etching, by the dielectric layer 402 in $SiO_2$, the high-k dielectric layer 413 in $HfO_2$, the protective layer 414 in TaN, the gate layer 403 in sacrificial polysilicon and the hard mask layer 404 in SiN.

The etching is carried out by using the hard mask defining area Z intended to subsequently form the gate and protecting said area during the operation.

According to step 302 represented in FIG. 1c, a conformal deposition of a layer 405 of SiN is carried out.

This layer 405 is then etched (step 303 in FIG. 1d) so as to only keep spacers 406. Spacers 406 define the channel w length of the transistor and ensure the electrical insulation between the gate and the junctions: They may be obtained via anisotropic etching of the SiN layer 405.

Doping is then carried out by ionic implantation of source and drain areas 407 and 408 on both sides of lateral spacers 406. Therefore in the case of producing an n-MOS transistor on a type p substrate 401, areas 407 and 408 are n+ doped. In order to restore the crystallinity of the material and placement of dopant atoms on substitutional sites, an implantation annealing (also designated activation annealing) is then carried out: the temperature of such annealing is on the order of 1000° C. It is therefore observed that the high-k dielectric layer 413 (contrary to the embodiment of FIGS. 1a to 1j) will undergo this activation annealing: the act of high-k layer 413 undergoing this annealing improves the electrical properties of the high-k. The protective layer 414 in mid-gap TaN is deposited on high-k layer 413 in $HfO_2$ in order to prevent the sacrificial polysilicon of layer 403 from mixing with the high-k when the junctions undergo activation annealing. This protective layer 414 is preferentially made of a metal that is chemically stable with relation to the high-k so that the material of this layer does not react with the high-k material.

In order to minimize the resistance of the drain and source areas made of doped monocrystalline silicon, a siliconizing step of these areas is also carried out; the siliconizing corresponds to the metallization of these drain and source areas by chemical reaction between the silicon and a metal (for example nickel) so as to form areas of low resistivity. This siliconizing step of junctions 407 and 408 is obtained at a temperature not exceeding 500° C. It should be noted that at this stage (silicided source and drain junctions), the thermal budget must no longer exceed 500° C. so as to not degrade the siliconizing.

Figure 2E:
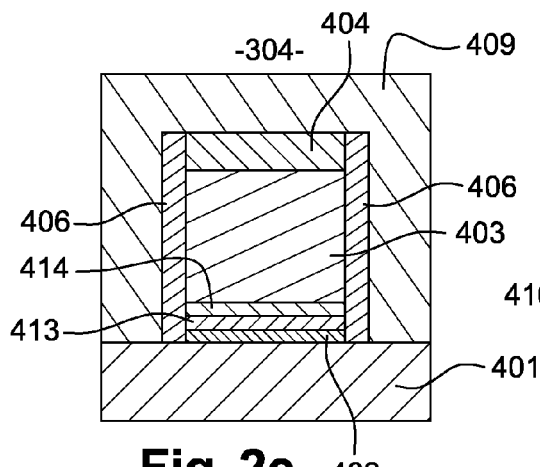
Figure 2F:
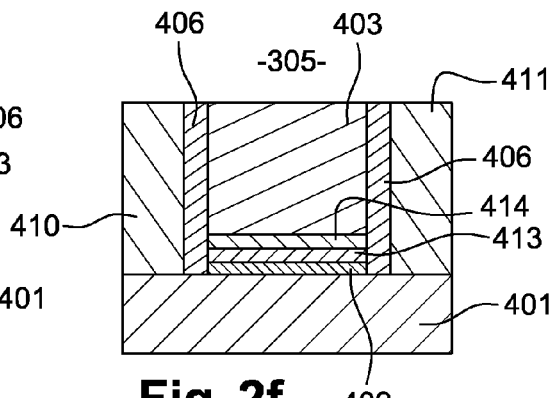
Figure 2G:
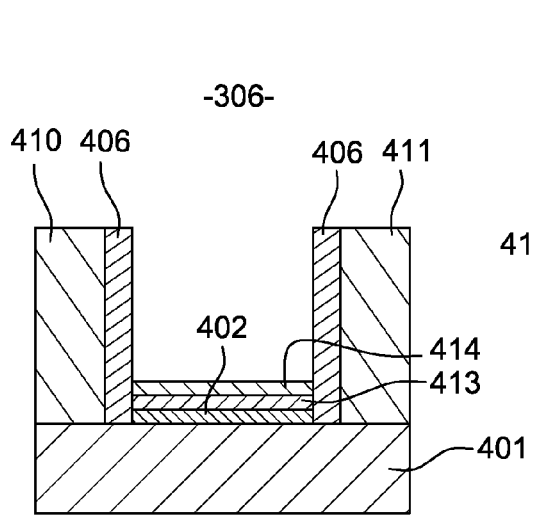

According to step 304 represented in FIG. 2e, filling is then carried out by using a TEOS (Tetra Ethyl Ortho Silane) type dielectric material 409 at a temperature of less than 500° C.

Chemical mechanical polishing, designated CMP (Chemical Mechanical Polishing), is then carried out (step 305 FIG. 2f) with a stop on polysilicon layer 403 so as to remove the added thickness formed by layer 404 of SiN and the layer 409 of TEOS from the upper part of the gate area. Drain and source areas 407 and 408 are protected by lateral parts 410 and 411 in TEOS.

The polysilicon layer 403 is a sacrificial layer. According to step 306 illustrated in FIG. 2g, this layer 403 is thus removed so as to expose a damascene cavity 412, for example by selective TMAH (tetramethyl ammonium hydroxide) etching with a stop on layer 414 in TaN: again the layer 414 in TaN serves as a protective layer for the high-k layer 413 (i.e., a chemical etch stop is avoided on the high-k material).

Figure 2H:
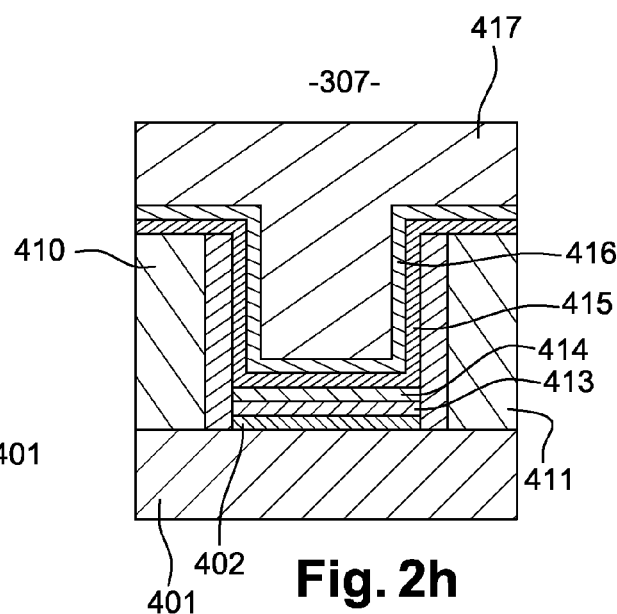
Figure 2I:
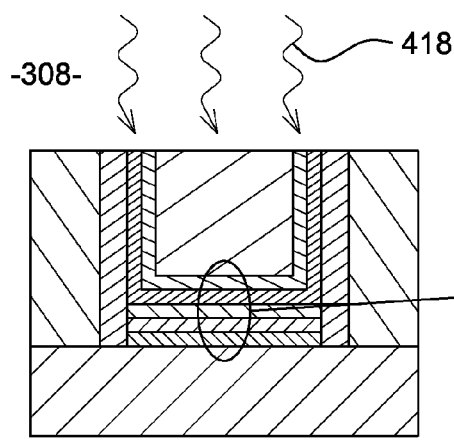

According to step 307 illustrated in FIG. 2h, the damascene cavity 412 represented in FIG. 1g is filled with a stack formed successively by:
 a functionalization layer 415 in TiMg (with a thickness equal to or less than 5 nm, for example on the order of 3 nm);
 a capping layer 416 in TiN (with a thickness equal to or less than 5 nm).

The act of choosing layers of a thin thickness (i.e., equal to or less than 5 nm) prevents mechanical stress on the gate stack.

The remainder of the damascene cavity is filled by a neutral metal 417 of the tungsten type W.

The capping layer 416 in TiN prevents air oxidation of the functionalization layer 415 in TiMg, the magnesium being particularly oxygen hungry.

According to step 308 (FIG. 2i), CMP polishing is carried out to eliminate the added thickness of material over the damascene cavity and then thermal annealing is carried out (illustrated by arrows 418) at a temperature preferentially equal to or greater than 300° C. and strictly less than 500° C. (it is noted that 500° C. constitutes the upper limit of annealing due to the thermal budget limitation linked to the prior siliconizing of the drain and source junctions).

FIG. 1j represents a zoom on the different layers 401, 402, 413, 414, 415, 416 and 417 illustrating phenomena connected to annealing.

Annealing of the functionalization layer 415 in TiMg diffuses the Mg through a protective layer 414. The TaN of the protective layer 414 initially Mid-gap then becomes type N (i.e., a work function of between 4.1 eV and 4.3 eV) by diffusion of Mg and nitrogen denudation.

As with the first embodiment, the assembly formed by the protective layer 414 and the functionalization layer 415 presents, after thermal activation, type N behavior.

Figure 2J:
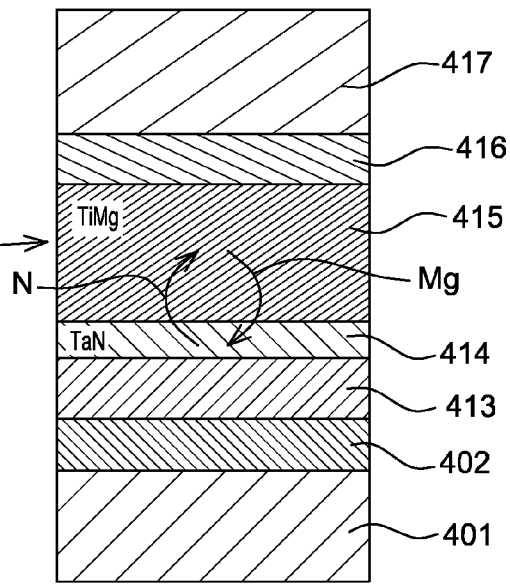

FIG. 3 illustrates a possible variation in the stacks represented respectively in FIGS. 1j and 2j, in particular for producing the functionalization layer used. In this instance, the stack made in the damascene cavity is formed here by the following layers:

- a layer 501 in Si
- a base layer 502 in $SiO_2$;
- a layer 513 in $HfO_2$;
- a protective layer 514 in TaN;
- a functionalization bilayer 515;
- a capping layer 516 in TiN;
- a neutral metal layer 517 in W.

The functionalization bilayer 515 is composed of 2 layers 515A and 515B in Ti and Mg deposited successively. Under the effect of annealing 518, the Mg from layer 515B will mix with the Ti from layer 515A and then diffuse towards the protective layer 514, the latter being nitrogen denuded such that the assembly formed by layers 514, 515A and 515B has an N type behavior.

FIGS. 4a to 4c more specifically illustrate an alternative to the embodiment of a capping layer capable of being used in the process according to the invention.

In this instance, as with the first and second embodiments, FIG. 4A represents an enlargement on the stack made in the damascene cavity formed first by the following layers:

- a layer 601 in Si
- a base layer 602 in $SiO_2$;
- a layer 613 in $HfO_2$;
- a protective layer 614 in TaN;
- a functionalization layer 615 in TiMg.

In FIG. 4b, the production of a capping layer 616 in TiN is done via the implantation 619 of nitrogen by low-temperature plasma nitriding of the functionalization layer 615 in TiMg. As nitrogen is more reactive with titanium compared to magnesium, the magnesium is pushed down and concentrated in functionalization layer 615 such that an upper capping layer 616 of TiN is created.

One finishes by filling the damascene cavity with a type W neutral metal 617 (FIG. 4c).

As already explained with reference to the first two embodiments, annealing 618 (after having performed CMP polishing removing the added thickness of material over the damascene cavity) then assists in the diffusion of m magnesium from the functionalization layer 615 into the protective layer 614.

FIG. 5 illustrates a possible variation for producing the protective layer 714 used in the process according to the invention to obtain an n-MOS gate compatible with producing a p-MOS transistor in "gate last" technology.

In this instance, the stack made in the damascene cavity is formed here by the following layers:

- a layer 701 in Si
- a base layer 702 in $SiO_2$;
- a layer 713 in $HfO_2$;
- a protective bilayer 714;
- a functionalization layer 715 in TiMg;
- a capping layer 716 in TiN;
- a neutral metal layer 717 in W.

The protective bilayer 714 is composed of 2 layers 714A and 714B respectively of type P TiN and mid-gap TaN deposited successively. Layer 714A of type P TiN is, for example, obtained by ALD (Atomic Layer Deposition).

Under the effect of annealing 718, the Mg from layer 715 will diffuse into the protective bilayer 714, layers 714A and 714B of the latter being nitrogen denuded such that the assembly formed by layers 715, 714A and 714B has an N type behavior.

The use of a TiN-ALD/mid-gap TaN bilayer enables, after integration, the n-MOS functions to be separated from the p-MOS functions of each transistor, in order to produce a CMOS circuit. The TiN-ALD in fact may subsequently enable production of the p-MOS function (i.e., the gate of the p-MOS transistor). In this case, the layer 714B of mid-gap TaN may be used as an etch stop layer for the functionalization layer 715 in TiMg (i.e., selective removal of TiMg compared to TaN) during the subsequent production of the p-MOS transistor. This use of the TiN-ALD/mid-gap-TaN bilayer is illustrated with reference to FIGS. 5a to 5d and 5d-bis.

As illustrated in FIG. 5a, therefore the invention starts with a stack within a damascene cavity formed by the following layers:

- a layer 701 in Si
- a base layer 702 in $SiO_2$;
- a layer 713 in $HfO_2$;
- a protective bilayer 714;
- a functionalization layer 715 in TiMg;
- a capping layer 716 in TiN.

As mentioned with reference to FIG. 5, protective bilayer 714 is composed of 2 layers 714A and 714B respectively of type P TiN and mid-gap TaN deposited successively.

The production of the p-MOS transistor is illustrated with reference to FIGS. 5b-bis to 5d-bis while the production of the n-MOS transistor is illustrated with reference to FIGS. 5b to 5d.

In FIG. 5b-bis, capping layer 716 TiN and functionalization layer 715 in TiMg are removed by etching by using the mid-gap TaN layer 714B as an etch stop layer (i.e., selective removal of TiMg compared to TaN).

In FIG. 5b, the stack from FIG. 5-a is kept intact.

With reference to FIGS. 5c and 5c-bis, the damascene cavity is filled by a neutral metal 717 and 717' of the tungsten W or Ni type.

With reference to FIG. 5d, under the effect of annealing 718, the Mg from layer 715 will diffuse into the protective bilayer 714, layers 714A and 714B of the latter being nitrogen denuded such that the assembly formed by layers 715, 714A and 714B has an N type behavior. The n-MOS function is therefore produced.

With reference to FIG. 5d-bis, a type p behavior is maintained (thanks to layer 714A) under the effect of annealing 718 since the functionalization layer 715 in TiMg was selectively removed from layer 714B in TaN.

In general, for implementation of the process according to the invention, the dielectric material is preferentially a material designated high-k; In the case of a high-k dielectric, the latter is present in the form of an Hf-based oxide (for example, $HfO_2$) and/or Si (for example, hafnium-based silicates $Hf_{1-x}Si_xO_y$), La, Al, Sr, Ti, Zn, Sn. This material may also be nitrided, for example HfSiO:N.

The high-k layer is deposited on a layer of silicon dioxide $SiO_2$ or SiO:N (which serves as the interface base layer). This base may be kept or removed when producing the transistor and may be produced in cold plasma oxidation technology.

The high-k protective layer is made in a metal that is chemically stable compared to the high-k. It is preferentially composed of a metal M that may also be $M_xN_y$ nitrided (for ex. TiN, TaN, WN, MoN), or a combination with an $M_xC_yN_z$ carbide (for ex. TiCN, TaCN). The metal M or its nitride is preferentially mid-gap of silicon or type P (i.e., work function greater than 4.6 eV), M may be a transition metal Ti, Ta, W, Mo. As already mentioned with reference to FIG. 5, the protective layer may be made by successive deposition of two layers, for ex. TiN-ALD (type P or P+)/TaN(type mid-gap).

The functionalization layer is composed of a chemical species having a low work function (i.e., work. function equal to or less than 4.1 eV) and a diffusion capacity that is compatible with the gate last technology. The species from columns IIA, IIIB and lanthanides enter into this category, particularly Mg, Ca, Se, Y.

The species from columns IIA preferentially enter into this category, particularly Mg and Ca. The free enthalpy of formation of the nitride from this species in the 0-1200° C. range must be less, in absolute value, than that of the metal nitride of the protective layer.

Therefore, the free enthalpy of formation at 273.15K of magnesium nitride and calcium nitride is respectively $\Delta G(273.15K)Mg3N2=-633.8$ kJ (for a mole of nitrogen) and $\Delta G(273.15K)Ca3N2=-622$ kJ. The absolute value of these free enthalpies is less than the absolute value of the free enthalpy of TiN and of TaN ($\Delta G(273.15K)TiN=-742.2$ kJ and $\Delta G(273.15K)TaN=-657.3$ kJ).

In addition, the free enthalpy of formation at 300K of magnesium nitride is $\Delta G(300K)Mg3N2=-633$ kJ (for a mole of nitrogen). The absolute value of this free enthalpy is less than the absolute value of the free enthalpy of formation of TiN and of TaN ($\Delta G(300k)TiN=-742$ kj, $\Delta G(300k)TaN=-657$ kj).

The magnesium or calcium may be mixed in an alloy with a metal (preferentially Ti, Ta, Zr or Hf) or a metal nitride (for example TiN, TaN, ZrN or HfN) leading, for example, to alloys TaMg, TiMg, ZrMg, HfMg, TaMgN, TiMgN, ZrMgN, HfMgN, TaCa, TiCa, ZrCa, HfCa, TaCaN, TiCaN, ZrCaN, HfCaN, TaMgCa, TiMgCa, ZrMgCa, HfMgCa, TaMgCaN, TiMgCaN, ZrMgCaN, HfMgCaN.

It will be noted that the Mg or the Ca of column IIA are advantageously used compared to the species from column IIIB such as Se or Y.

In fact, in the case of scandium nitride or yttrium nitride, the free enthalpy of formation is respectively $\Delta G(273.15K)ScN=-710.4$ kJ and $\Delta G(273.15K)YN=-701.9$ kJ.). The absolute value of this free enthalpy is therefore much closer to (or even greater than) the absolute value of the free enthalpy of formation of TiN and of TaN. The Scandium and Yttrium in the Ti or Ta alloy may therefore be nitrided if the alloy is deposited on TaN to the extent that the free enthalpy of formation of TaN $\Delta G(273.15K)TaN=-657.3$ kJ is less in absolute value than the free enthalpy of formation of the scandium nitride or yttrium nitride.

The capping layer is preferentially a nitrided metal (for example TiN, TaN, TiCN or TaCN).

The nitriding of the metal of the protective and/or functionalization layer may be performed by plasma treatment (for example, by low-temperature plasma nitriding or by ionic implantation). This treatment may serve several purposes:
  push the Mg down into the protective layer as presented in FIGS. 4a to 4c;
  saturate the functionalization layer in nitrogen to prevent nitrogen denudation of the protective layer and therefore limit, stop or control the diffusion of Mg into the protective layer. The latter case may be of interest in the production of a complementary p-MOS transistor.

Of course, the process according to the invention is not limited to the embodiments that have just been described for indicative and in no way limiting purposes with reference to FIGS. 1 to 5.

Therefore, this invention is not limited to an application in the field of n-MOS metal gate production in gate last technology; For example, the invention may be extended to other fields of embodiment of electrodes, particularly on SOI substrates or for FinFET transistors, in the field of memories (Flash Memories, Oxram, GST, etc.), in Back-end technology in interconnections or for more emergent nanotube-based technologies.

In addition, the damascene cavity may be filled by a metal other than tungsten W, for example Ni.

The invention claimed is:

1. A process for producing a conducting electrode on a substrate comprising:
  depositing a layer made with a dielectric material;
  depositing, on the dielectric layer, a protective layer made of a nitride of a metal;
  depositing a functionalization layer made of a material comprising a chemical species such that the free enthalpy of formation of a nitride of said species is less, in absolute value, than the free enthalpy of formation of the nitride of the metal of said protective layer over a temperature range of between 0and 1200° C., said chemical species being chosen from among the following species: Mg or Ca;
  annealing an assembly comprising said protective layer and said functionalization layer such that the chemical species at least partially diffuse from said functionalization layer into said protective layer and nitrogen atoms at least partially migrate from said protective layer into said functionalization layer, said conducting electrode including said protective and functionalization layers after annealing.

2. The process according to claim 1, wherein the dielectric layer is made with an insulation material in which the dielectric constant is equal to or greater than that of silicon dioxide, SiO:N or a high-k material.

3. The process according to claim 1, wherein thicknesses of the protective and functionalization layers are equal to or less than 5 nm.

4. The process according to claim 1, wherein the material of the functionalization layer is chosen from among the following materials: TaMg, TiMg, ZrMg, HfMg, TaMgN or TiMgN, ZrMgN, HfMgN, TaCa, TiCa, ZrCa, HfCa, TaCaN, TiCaN, ZrCaN, HfCaN, TaMgCa, TiMgCa, ZrMgCa, HfMgCa, TaMgCaN, TiMgCaN, ZrMgCaN, HfMgCaN.

5. The process according to claim 1, wherein the protective layer is a layer in TiN, TaN, TiCN or TaCN presenting, before annealing, a work function in the middle of the silicon bandgap.

6. The process according to claim 1, wherein the protective layer is produced in the form of a bilayer by deposition of a first layer that behaves as a P-doped material before annealing, and a second layer presenting, before annealing, a work function in the middle of the silicon bandgap.

7. The process according to claim 1, wherein the protective layer is produced in the form of a bilayer by deposition of a layer of TiN that behaves as a P-doped material before annealing, and a layer of TaN presenting, before annealing, a work function in the middle of the silicon bandgap.

8. The process according to claim 1, wherein the annealing temperature of the assembly comprising said protective layer and said functionalization layer is strictly less than 500° C.

9. The process according to claim 1, comprising depositing a dielectric interface base layer between the dielectric layer and the substrate.

10. The process according to claim 1, comprising depositing a capping layer above the functionalization layer capable of protecting the functionalization layer from oxidation, said capping layer undergoing said annealing.

11. The process according to claim 10, wherein the capping layer is made of a nitrided material selected from the group consisting of TiN, TaN, TiCN, and TaCN.

12. The process according to claim 11, wherein the nitriding of the capping layer is obtained by plasma treatment.

13. A process for producing a conducting electrode on a substrate comprising:

depositing a dielectric interface base layer on the substrate;

depositing a layer in sacrificial polysilicon;

producing drain and source areas;

producing a damascene cavity by removal of the sacrificial polysilicon;

depositing a layer made of a dielectric material, said dielectric material being a high-k type material;

depositing, on the dielectric layer, a protective layer made of a nitride of a metal;

depositing, on the protective layer, a functionalization layer, the functionalization layer made of a material comprising a chemical species such that the free enthalpy of formation of a nitride of said species is less, in absolute value, than the free enthalpy of formation of the nitride of the metal of said protective layer over a temperature range of between 0 and 1200° C., said chemical species being chosen from among the following species: Mg or Ca;

depositing, on the functionalization layer, a capping layer, the capping layer capable of protecting the functionalization layer from oxidation, said capping layer undergoing said annealing;

depositing a metallic material to fill in the remainder of the damascene cavity;

annealing the assembly comprising said protective layer and said functionalization layer such that the species partially diffuse from said functionalization layer into said protective layer and nitrogen atoms partially migrate from said protective layer into said functionalization layer, said conducting electrode including said protective and functionalization layers after annealing.

14. A process for producing a conducting electrode on a substrate comprising:

depositing a dielectric interface base layer on the substrate;

depositing, on the dielectric interface base layer, a layer made of a dielectric material, said dielectric material being a high-k type material;

depositing, on the dielectric layer, a protective layer made of the nitride of a metal;

depositing a layer in sacrificial polysilicon;

producing drain and source areas;

producing a damascene cavity by removal of the sacrificial polysilicon with a stop on the protective layer;

depositing, on the protective layer, a functionalization layer, the functionalization layer made of a material comprising a chemical species such that the free enthalpy of formation of a nitride of said species is less, in absolute value, than the free enthalpy of formation of the nitride of the metal of said protective layer over a temperature range of between 0 and 1200° C., said chemical species being chosen from among the following species: Mg or Ca;

depositing, on the functionalization layer, a capping layer, the capping layer capable of protecting the functionalization layer from oxidation, said capping layer undergoing said annealing;

depositing a metallic material to fill in the remainder of the damascene cavity;

annealing the assembly comprising said protective layer and said functionalization layer such that the species partially diffuse from said functionalization layer into said protective layer and the nitrogen atoms partially migrate from said protective layer into said functionalization layer, said conducting electrode including said protective and functionalization layers after annealing.

15. An n-MOS transistor comprising an transistor gate having an electrode produced by a process according to claim 1.

16. The process according to claim 2, wherein the dielectric constant is equal to or greater than that of $SiO_2$.

* * * * *